United States Patent
Hom et al.

(10) Patent No.: US 12,298,350 B2
(45) Date of Patent: May 13, 2025

(54) CELL MATCHING ACROSS MULTIPLE CHARACTERISTICS DURING BATTERY ASSEMBLY

(71) Applicant: Wisk Aero LLC, Mountain View, CA (US)

(72) Inventors: Lewis Romeo Hom, Mountain View, CA (US); Thomas P. Muniz, Sunnyvale, CA (US); Patrick K. Herring, Redwood City, CA (US)

(73) Assignee: Wisk Aero LLC, Mountain View, CA (US)

( * ) Notice: Subject to any disclaimer, the term of this patent is extended or adjusted under 35 U.S.C. 154(b) by 0 days.

(21) Appl. No.: 18/741,171

(22) Filed: Jun. 12, 2024

(65) Prior Publication Data
US 2024/0329140 A1    Oct. 3, 2024

Related U.S. Application Data

(63) Continuation of application No. 18/366,442, filed on Aug. 7, 2023, now Pat. No. 12,044,738, which is a
(Continued)

(51) Int. Cl.
*G01R 31/367*    (2019.01)
*G01R 31/396*    (2019.01)
(Continued)

(52) U.S. Cl.
CPC ......... *G01R 31/367* (2019.01); *G01R 31/396* (2019.01); *G06F 7/08* (2013.01);
(Continued)

(58) Field of Classification Search
CPC ....... G01R 31/367; G01R 31/396; G06F 7/08; H01M 10/0404; H01M 10/4221;
(Continued)

(56) References Cited

U.S. PATENT DOCUMENTS 5,780,992 A    7/1998   Beard
8,892,478 B1 *   11/2014   Bickford ................ G06N 20/00
                                                           374/2
(Continued)

FOREIGN PATENT DOCUMENTS

CA        2463135 C   *   10/2014       H01M 10/0436
CN    101814632 A      8/2010
(Continued)

OTHER PUBLICATIONS

An, Fuqian et. al, "Cell sorting for parallel lithium-ion battery systems: Evaluation based on an electric circuit model," Journal of Energy Storage, vol. 6, pp. 195-203, 2016. (Year: 2016).*
(Continued)

*Primary Examiner* — Jeffrey P Aiello
(74) *Attorney, Agent, or Firm* — Kilpatrick Townsend & Stockton LLP

(57) ABSTRACT

For each cell in a plurality of cells from a same manufacturing run, a first and a second cell characteristic are received in order to obtain a plurality of cell characteristics. For each cell, a batch compatibility number that is associated with a number of compatible cells that that cell is compatible with is determined based at least in part on the plurality of cell characteristics. The plurality of cells is sorted according to the batch compatibility numbers to obtain a sorted list of cells. A plurality of compatible cells to include in a battery is selected from the plurality of cells, including by evaluating the plurality of cells according to the order of the sorted list of cells and beginning with the lowest batch compatibility number.

20 Claims, 13 Drawing Sheets

Battery (Without Lid)

US 12,298,350 B2
Page 2

Related U.S. Application Data continuation of application No. 17/900,500, filed on Aug. 31, 2022, now Pat. No. 11,768,246, which is a continuation of application No. 16/287,882, filed on Feb. 27, 2019, now Pat. No. 11,467,216, which is a continuation of application No. 15/400,488, filed on Jan. 6, 2017, now Pat. No. 10,274,543.

(51) Int. Cl.
| | |
|---|---|
| *G06F 7/08* | (2006.01) |
| *H01M 6/50* | (2006.01) |
| *H01M 10/04* | (2006.01) |
| *H01M 10/42* | (2006.01) |
| *H01M 10/48* | (2006.01) |

(52) U.S. Cl.
CPC ....... *H01M 6/5011* (2013.01); *H01M 6/5066* (2013.01); *H01M 10/0404* (2013.01); *H01M 10/4221* (2013.01); *H01M 10/4285* (2013.01); *H01M 10/482* (2013.01)

(58) Field of Classification Search
CPC ........... H01M 10/4285; H01M 10/482; H01M 6/5011; H01M 6/5066; Y02P 70/50
USPC ................ 320/116, 136, 106, 134, 107, 119; 324/434, 426, 500; 702/63, 188, 182, 702/189, 104, 127
See application file for complete search history.

(56) References Cited

U.S. PATENT DOCUMENTS

| | | | | |
|---|---|---|---|---|
| 8,896,315 | B1 * | 11/2014 | Davies | H02J 7/0016 320/120 |
| 10,274,543 | B2 | 4/2019 | Hom et al. | |
| 10,361,569 | B2 * | 7/2019 | Hayashizaki | H01M 10/4207 |
| 11,467,216 | B2 | 10/2022 | Hom et al. | |
| 11,768,246 | B2 | 9/2023 | Hom et al. | |
| 2005/0099161 | A1 | 5/2005 | Sato | |
| 2006/0012330 | A1 * | 1/2006 | Okumura | H02J 7/0024 320/103 |
| 2009/0130541 | A1 * | 5/2009 | Emori | H02J 7/0019 429/61 |
| 2010/0040939 | A1 * | 2/2010 | Maegawa | H01M 10/4242 429/49 |
| 2010/0196748 | A1 | 8/2010 | Ellwanger | |
| 2011/0239445 | A1 * | 10/2011 | Ibi | H01M 50/204 29/623.1 |
| 2012/0025786 | A1 | 2/2012 | Heizer et al. | |
| 2012/0161707 | A1 * | 6/2012 | Kim | H02J 7/0016 320/118 |
| 2013/0214730 | A1 * | 8/2013 | Lu | H04L 12/2807 320/162 |
| 2015/0042351 | A1 * | 2/2015 | Greenberg | H01M 10/4207 324/434 |

FOREIGN PATENT DOCUMENTS

| | | | |
|---|---|---|---|
| CN | 103956513 A | 7/2014 | |
| JP | 2012252926 A | 12/2012 | |
| JP | 2015187915 A | 10/2015 | |
| TW | 201621532 A | 6/2016 | |
| WO | WO-2014129757 A1 * | 8/2014 | ........... G01R 19/165 |

OTHER PUBLICATIONS

U.S. Appl. No. 15/400,488 , "Advisory Action", Apr. 6, 2018, 3 pages.
U.S. Appl. No. 15/400,488 , "Final Office Action", Oct. 5, 2018, 6 pages.
U.S. Appl. No. 15/400,488 , "Final Office Action", Jan. 25, 2018, 7 pages.
U.S. Appl. No. 15/400,488 , "Non-Final Office Action", Sep. 25, 2017, 10 pages.
U.S. Appl. No. 15/400,488 , "Non-Final Office Action", Jun. 6, 2018, 5 pages.
U.S. Appl. No. 15/400,488 , "Notice of Allowance", Jan. 3, 2019, 7 pages.
U.S. Appl. No. 16/287,882 , "Corrected Notice of Allowability", Sep. 2, 2022, 2 pages.
U.S. Appl. No. 16/287,882 , "Non-Final Office Action", Dec. 10, 2021, 13 pages.
U.S. Appl. No. 16/287,882 , "Non-Final Office Action", Jul. 29, 2021, 13 pages.
U.S. Appl. No. 16/287,882 , "Notice of Allowance", Jun. 2, 2022, 7 pages.
U.S. Appl. No. 16/287,882 , "Supplemental Notice of Allowability", Aug. 5, 2022, 2 pages.
U.S. Appl. No. 17/900,500 , "Non-Final Office Action", Dec. 19, 2022, 11 pages.
U.S. Appl. No. 17/900,500 , "Notice of Allowance", May 5, 2023, 10 pages.
U.S. Appl. No. 18/366,442 , "Notice of Allowance", Mar. 12, 2024, 9 pages.
CN201780075856.7 , "Notice of Decision to Grant", Apr. 6, 2022, 4 pages.
CN201780075856.7 , "Office Action", Sep. 27, 2021, 11 pages.
Knuth , "The Art of Computer Programming", vol. 3, Sorting and Searching, Apr. 24, 1998, 46 pages.
NZ753964 , "First Examination Report", Feb. 7, 2020, 2 pages.
NZ753964 , "Notice of Acceptance", Dec. 3, 2020, 1 page.
NZ753964 , "Second Examination Report", Sep. 2, 2020, 1 page.
NZ766957 , "First Examination Report", May 17, 2023, 2 pages.
NZ766957 , "Notice of Acceptance", May 17, 2024, 2 pages.
NZ766957 , "Second Examination Report", Jun. 9, 2023, 1 page.
PCT/US2017/012673 , "International Preliminary Report on Patentability", Jul. 18, 2019, 7 pages.
PCT/US2017/012673 , "International Search Report and Written Opinion", Mar. 23, 2017, 7 pages.
Smart et al., "Performance Testing of Yardney MCMB-LiNiCoAIO2 Lithium-ion Cells Possessing Electrolytes With Improved Safety Characteristics", Jun. 11, 2012, 4 pages.
Young et al., "Electric Vehicle Battery Technologies", Part of the Power Electronics and Power Systems book series (PEPS), Oct. 30, 2012, 50 pages.

* cited by examiner

|  | Cell 1 | Cell 2 | Cell 3 | Cell 4 | Cell 5 | Cell 6 |
|---|---|---|---|---|---|---|
| Capacity | C1 | C2 | C3 | C4 | C5 | C6 |
| Open Circuit Voltage | V1 | V2 | V3 | V4 | V5 | V6 |
| Resistance | R1 | R2 | R3 | R4 | R5 | R6 |
| Self-Discharge Rate | D1 | D2 | D3 | D4 | D5 | D6 |

Cell Characteristic Values

|        | Cell 1 | Cell 2 | Cell 3 | Cell 4 | Cell 5 | Cell 6 |
|--------|--------|--------|--------|--------|--------|--------|
| Cell 1 | N/A    | IC     | C      | C      | IC     | C      |
| Cell 2 | IC     | N/A    | IC     | C      | C      | C      |
| Cell 3 | C      | IC     | N/A    | C      | IC     | IC     |
| Cell 4 | C      | C      | C      | N/A    | IC     | C      |
| Cell 5 | IC     | C      | IC     | IC     | N/A    | C      |
| Cell 6 | C      | C      | IC     | C      | C      | N/A    |

Cell Compatibility Matrix
(C = Compatible; IC = Incompatible)

FIG. 5

|  | Batch Compatibility Number |
|---|---|
| Cell 6 | 4 |
| Cell 4 | 4 |
| Cell 2 | 3 |
| Cell 1 | 3 |
| Cell 5 | 2 |
| Cell 3 | 2 |

Sorted List of Cells

Evaluate from Bottom to Top

CELL MATCHING ACROSS MULTIPLE CHARACTERISTICS DURING BATTERY ASSEMBLY

CROSS REFERENCE TO OTHER APPLICATIONS

This application is a continuation of U.S. patent application Ser. No. 18/366,442, entitled CELL MATCHING ACROSS MULTIPLE CHARACTERISTICS DURING BATTERY ASSEMBLY filed Aug. 7, 2023, which is a continuation of U.S. patent application Ser. No. 17/900,500, entitled CELL MATCHING ACROSS MULTIPLE CHARACTERISTICS DURING BATTERY ASSEMBLY filed Aug. 31, 2022, now U.S. Pat. No. 11,768,246 issued Sep. 26, 2023, which is a continuation of U.S. patent application Ser. No. 16/287,882, entitled CELL MATCHING ACROSS MULTIPLE CHARACTERISTICS DURING BATTERY ASSEMBLY filed Feb. 27, 2019, now U.S. Pat. No. 11,467,216 issued Oct. 11, 2022, which is a continuation of U.S. patent application Ser. No. 15/400,488, entitled CELL MATCHING ACROSS MULTIPLE CHARACTERISTICS DURING BATTERY ASSEMBLY filed Jan. 6, 2017, now U.S. Pat. No. 10,274,543 issued Apr. 30, 2019, the disclosures of which are incorporated herein by reference for all purposes.

BACKGROUND OF THE INVENTION

Some types of batteries include multiple cells and during assembly of such batteries, the cells to include in a particular battery are selected. Although the pool of cells on which battery matching is performed may be from the same lot or manufacturing run, there will typically be some variation in the (e.g., electrical) characteristics of the cells. Batteries perform better when the all of the cells in a particular battery are matched. Although techniques exist for matching cells according to a single characteristic, there is no technique to match cells across multiple cell characteristics. This is not a straightforward problem since cell characteristics are often uncorrelated so that even though two cells are compatible with respect to one cell characteristic, it does not necessarily hold true that the cells will also be compatible with respect to another cell characteristic. New techniques to match cells across multiple cell characteristics would be desirable since it may reduce the number of leftover cells which are discarded.

BRIEF DESCRIPTION OF THE DRAWINGS

Various embodiments of the invention are disclosed in the following detailed description and the accompanying drawings.

FIG. 2 is a table illustrating an embodiment of cell characteristics which are used to match cells.

FIG. 5 is a diagram illustrating an embodiment of a cell compatibility matrix.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Various embodiments of a technique to match cells (e.g., during assembly of one or more batteries) across multiple cell characteristics are described herein. First, an example of a battery is described for which cells may be selected according to the technique(s) described herein. Then, various embodiments of cell matching techniques are described.

Figure 1:
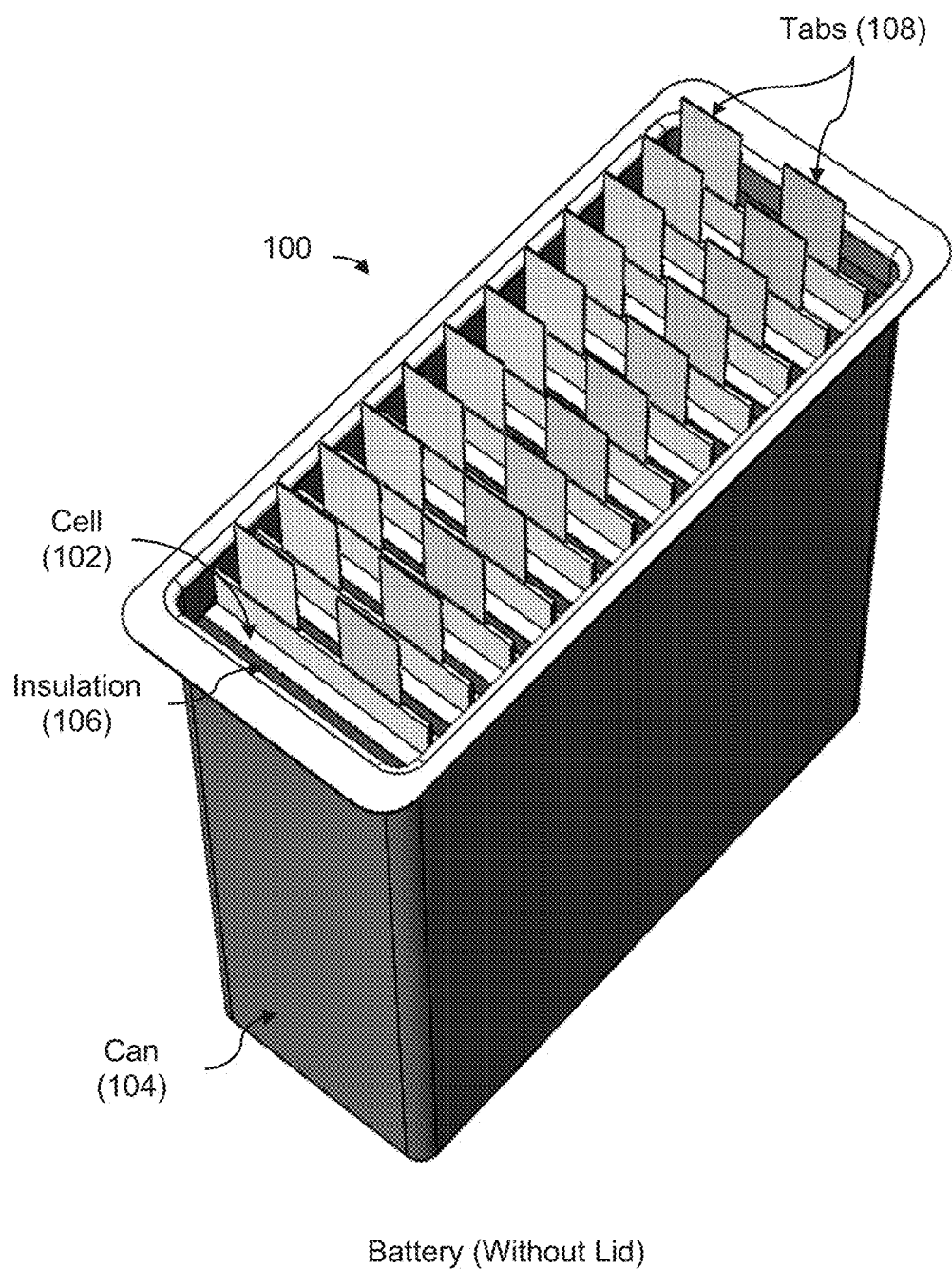
FIG. 1 is a diagram illustrating an embodiment of a battery which includes a plurality of cells.

FIG. 1 is a diagram illustrating an embodiment of a battery which includes a plurality of cells. In the example shown, battery 100 includes multiple cells (102) which may be matched or otherwise selected according to one or more of the techniques described herein. In this example, a battery includes 12 cells; other battery embodiments may include some other number of cells. A metal can (104) is used to hold alternating layers of cells (102) and insulation (106). The layers of insulation (106) act as a fire retardant to slow the spread of fire from cell-to-cell in the event one of the cells in the battery ignites. Tabs (108) are connected to the cells and are used to carry the power generated by the cells out of the battery. The tops of the tabs are connected to the bottom of a lid (not shown) which is attached to the top of the can. The top of the lid has a positive terminal and a negative terminal from which the power generated by the cells in the battery can be accessed.

A battery which includes multiple cells as shown here performs better when all of the cells in the battery match across multiple cell characteristics of interest. During battery assembly, a multi-characteristic cell matching process (some examples of which are described in more detail below) is performed on a group of unmatched or ungrouped cells so that cells to include in a battery are identified. For example, suppose 100 cells are run through the cell matching process. If the process identifies N groups of 12 cells, then N batteries will be assembled and there will be 100−(12N) leftover cells. Battery manufacturers may not want to mix cells from different lots or manufacturing runs with each other, so it may be desirable to minimize the number of leftover cells since any leftover cells may be discarded.

The following figure describes some exemplary cell characteristics which in subsequent examples are used to match cells.

FIG. 2 is a table illustrating an embodiment of cell characteristics which are used to match cells. In examples described herein, cell characteristics of capacity (e.g., in units of Ah), open circuit voltage (e.g., in units of volts), resistance (e.g., in units of ohms), and self-discharge rate (e.g., in units of µA) are used to match the cells. The values for capacity, open circuit voltage, resistance, and self-discharge rate are shown respectively in rows 200-203 for six exemplary cells. Naturally, these cell characteristics are merely exemplary and the techniques described herein may incorporate any combination of cell characteristics. In examples described herein, it is assumed that the cells have already been tested to obtain values for all of the cell characteristics of interest and measurement techniques are not described herein for brevity. Similarly, for simplicity and brevity, this table only shows six cells. Naturally, a real-world battery assembly process may perform cell matching on a much larger pool of cells.

One objective during the cell matching process is to ensure that all of the cells in a given battery are matched. More specifically, two cells are considered to be a match (sometimes referred to as a pair match) if the difference between each characteristic is within some corresponding tolerance. For example, for cell 1 (see column 204) and cell 2 (see column 206) in the table to be considered a match:

$|C1-C2|$ should not exceed $C_{tolerance}$; and $|V1-V2|$ should not exceed $V_{tolerance}$; and $|R1-R2|$ should not exceed $R_{tolerance}$; and $|D1-D2|$ should not exceed $D_{tolerance}$.

If even one of the cell characteristics has a difference that exceeds the corresponding tolerance, then that pair of cells is not a match (i.e., they are incompatible) and they should not be put into the same battery. Naturally, that pair of incompatible cells may be separated and (if possible) included in different batteries.

Unfortunately, the characteristics are not strongly correlated and a pair of cells may be compatible according to one characteristic but not another characteristic. The following figure shows an example of this.

Figure 3:
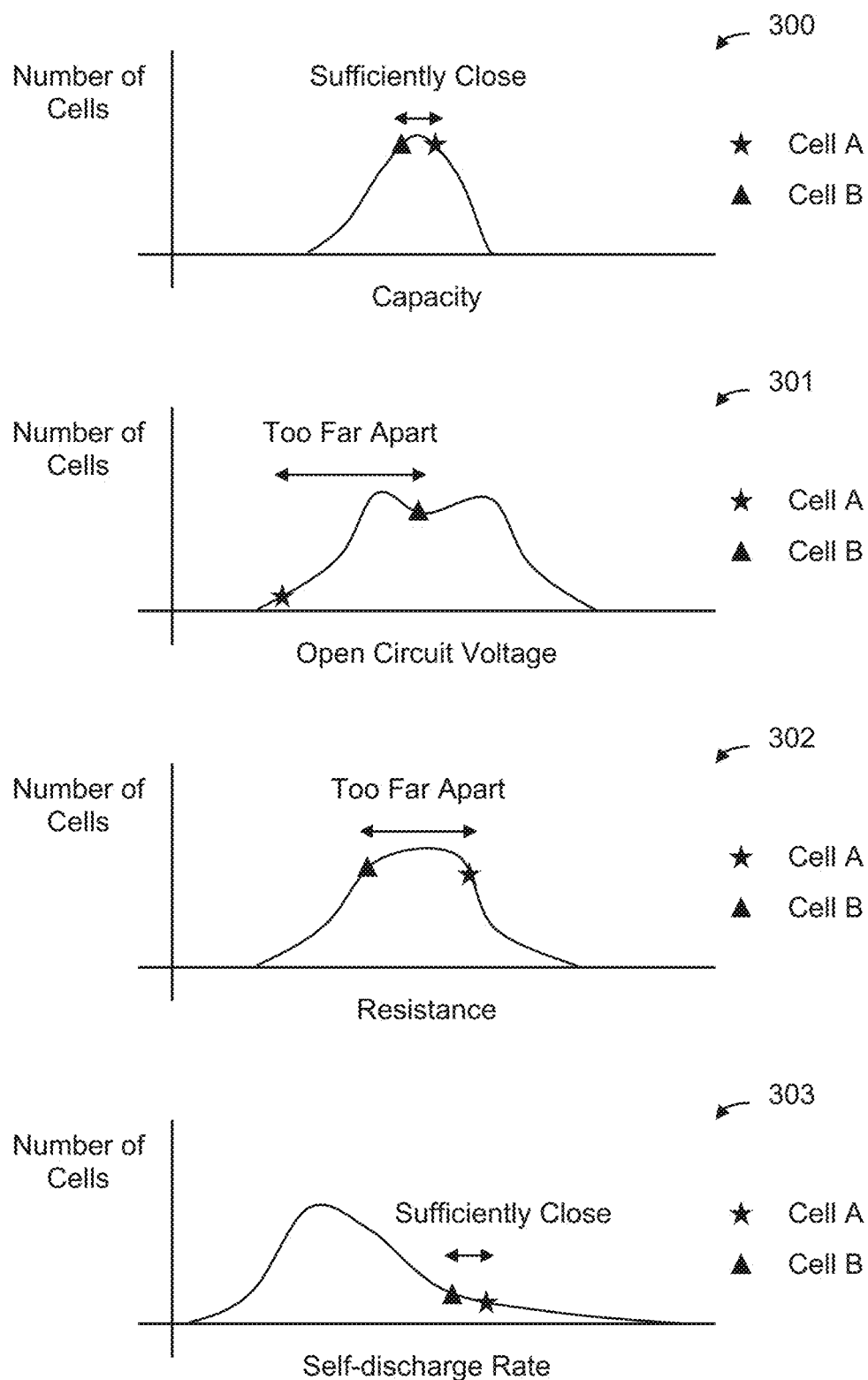
FIG. 3 is a diagram illustrating an embodiment of distributions for cell characteristics.

FIG. 3 is a diagram illustrating an embodiment of distributions for cell characteristics. In the example shown, diagrams 300-303 respectively show example distributions for capacity, open circuit voltage, resistance, and self-discharge rate. As shown, all of the distributions have a different shape.

The diagrams also show where two exemplary cells fall within the distributions. Cell A is represented with a star and cell b is represented with a triangle. With respect to capacity (see diagram 300) and self-discharge rate (see diagram 303), the two cells are compatible because the differences in values do not exceed the relevant tolerances. To put it another way, they are sufficiently close to each other with respect to those characteristics. However, with respect to open circuit voltage (see diagram 301) and resistance (see diagram 302), the cells are incompatible because the differences in values for those characteristics exceeds the relevant tolerance. To put it another way, the values are too far apart for those characteristics.

The following figure describes an exemplary cell matching process which in some embodiments uses the four exemplary cell characteristics shown in FIG. 2.

Figure 4:
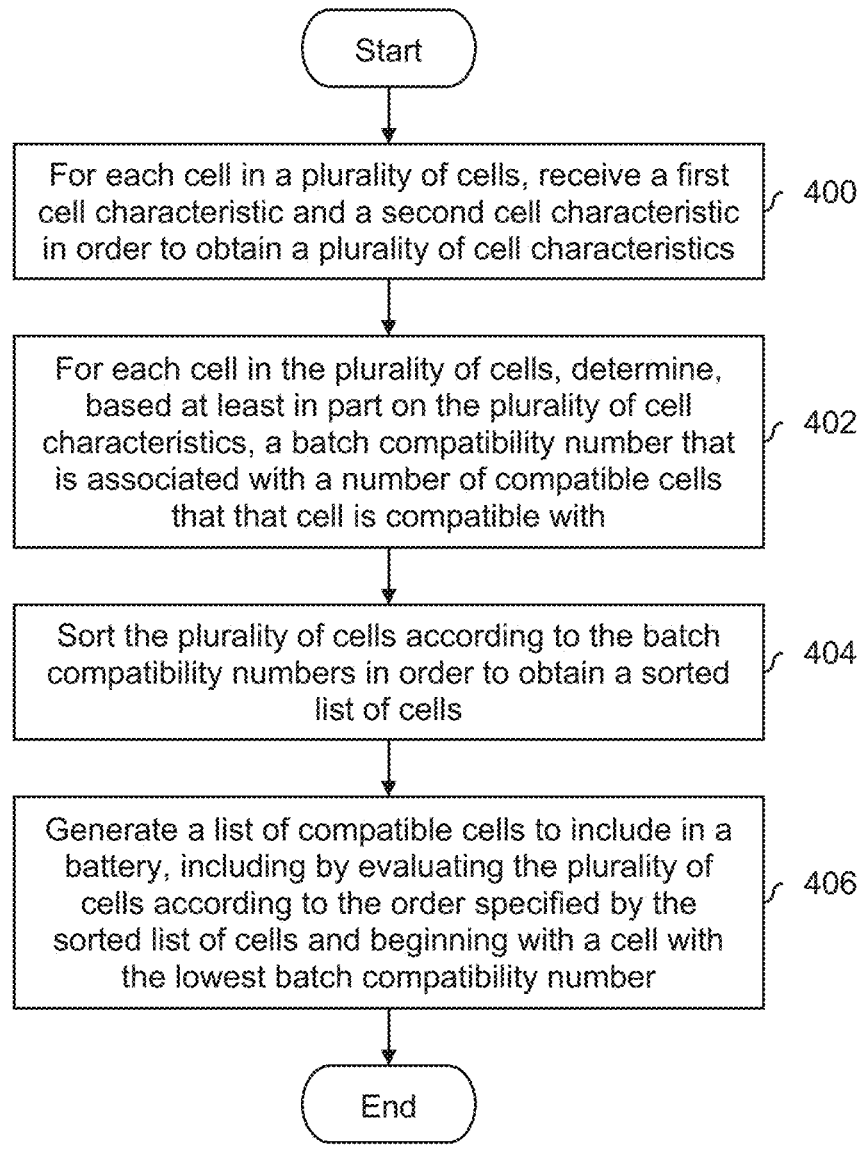
FIG. 4 is a flowchart illustrating an embodiment of a process to perform cell matching across multiple cell characteristics.

FIG. 4 is a flowchart illustrating an embodiment of a process to perform cell matching across multiple cell characteristics. In some embodiments, the process is performed during a battery assembly process where hundreds or thousands of cells from the same cell manufacturing run or lot are evaluated across multiple cell characteristics of interest and are identified for inclusion in a battery.

At 400, for each cell in a plurality of cells, a first cell characteristic and a second cell characteristic are received in order to obtain a plurality of cell characteristics. Naturally, the cell matching process may be performed using any number of characteristics of interest and additional cell characteristics may be obtained. In the example of FIG. 2, four cell characteristics are received for six cells and the table shown there is one example of a plurality of cell characteristics which may be received at step 400.

At 402, for each cell in the plurality of cells, a batch compatibility number that is associated with a number of compatible cells that that cell is compatible with is determined based at least in part on the plurality of cell characteristics. In some embodiments, step 402 includes generating a cell compatibility matrix which indicates (e.g., for all possible pairs of cells) whether a given pair of cells is compatible (and therefore can be put into the same battery together) across the first cell characteristic, the second cell characteristic, and any other cell characteristics of interest (if applicable). In some embodiments, the batch compatibility number counts a cell's compatibility with itself when calculating the batch compatibility number. In some other embodiments, a cell's compatibility with itself is not counted towards that cell's batch compatibility number. The following figure shows an example cell compatibility matrix.

FIG. 5 is a diagram illustrating an embodiment of a cell compatibility matrix. In the example shown, each entry in cell compatibility matrix 500 indicates whether a particular pair of cells is compatible with each other. Entries along the diagonal correspond to a comparison of a given cell with itself and so "not applicable" is shown for those entries. Naturally, in some embodiments, a process may choose to populate entries along the diagonal of a cell compatibility matrix with a compatible indication or an incompatible indication (e.g., in the pseudocode examples below, the cell compatibility matrix is populated so that cell i is compatible with cell i (i.e., itself)). Since the entry for (cell i, cell j) must be the same as the entry for (cell j, cell i), the table is symmetric along the diagonal and this property may be used to populate some of the entries in an n×n table (e.g., instead of performing the same compatibility check again). In some embodiments, an n×n table (such as the one shown) is condensed into something smaller since the n×n table contains duplicate information.

A pairwise cell compatibility test which checks all cell characteristics of interest may be used to populate the exemplary cell compatibility matrix shown. The following figure describes one example where there are two cell characteristics of interest.

Figure 6:
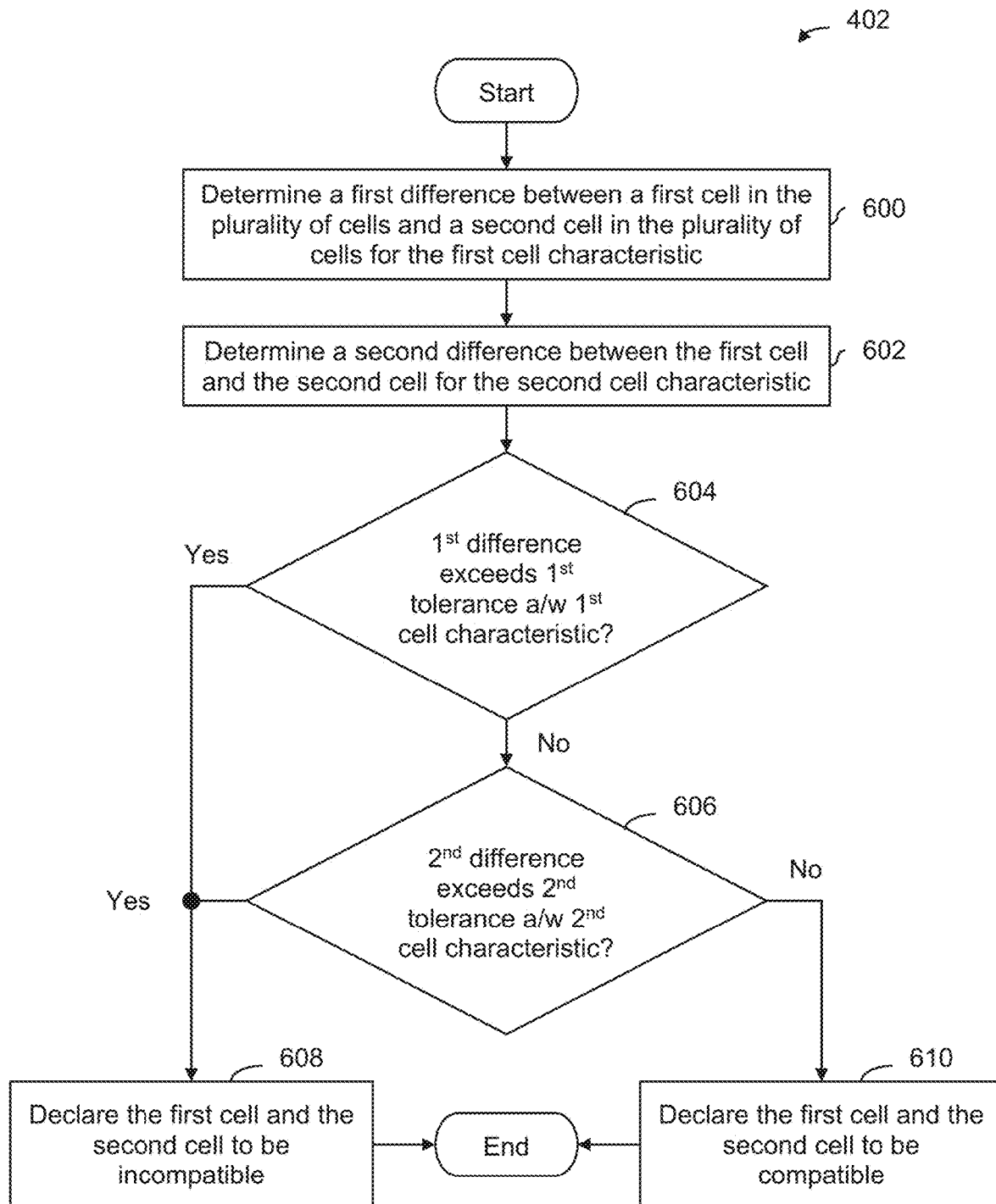
FIG. 6 is a flowchart illustrating an embodiment of process for a pairwise cell compatibility test.

FIG. 6 is a flowchart illustrating an embodiment of process for a pairwise cell compatibility test. In some embodiments, the example process is used to determine the number of compatible cells at step 402 in FIG. 4. In some embodiments, the example process is used to populate a cell compatibility matrix, such as the one shown in FIG. 5. In the example shown, compatibility is evaluated based on two cell characteristics of interest. Naturally, the exemplary process shown may be expanded upon (e.g., by repeating certain steps) in order to evaluate a pair of cells across three or more cell characteristics of interest.

At 600, a first difference is determined between a first cell in the plurality of cells and a second cell in the plurality of cells for the first cell characteristic. At 602, a second difference is determined between the first cell and the second cell for the second cell characteristic. For example, in the equations above, |C1−C2| (alternatively, C1−C2) is an example of step 600 and |V1−V2| (alternatively, V1−V2) is an example of step 602.

At 604, it is determined if the first difference exceeds a first tolerance associated with the first cell characteristic. For example, $C_{tolerance}$ (from the equations above) is an example of a first tolerance. If it is determined at step 604 that first difference exceeds the first tolerance, then the first cell and the second cell are declared to be incompatible at step 608.

If it is determined at step 604 that the first difference does not exceeds the first tolerance, then at 606 it is determined if the second difference exceeds a second tolerance associated with the second cell characteristic. For example, $C_{tolerance}$ is an example of a second tolerance from the equations above. If it is determined at step 606 that the second difference exceeds the second tolerance, the first cell and the second cell are declared to be incompatible at step 608. Otherwise, the first cell and the second cell are declared to be compatible at step 610. In other words, the differences in values for all cell characteristics of interest must be within their respective tolerances in order for the two cells to be compatible.

The following shows another example where a (e.g., unsorted) cell compatibility matrix is generated in pseudocode:

```
Define nCells as the number of cells in the batch
Define a [nCells x nCells] matrix M, the unsorted
compatibility matrix
/*Loop through each cell, checking for compatibility with
all other cells in the batch */
For each cell k:
   For each cell j:
      If cell k's attributes are within tolerances of
      cell j's attributes :
         M(k,j) = 1
      else
         M(k,j) = 0
      end
   end
end
/*This will generate a matrix with each cell's
compatibility with every other cell. M(k,j) is 1 if cell k
is compatible with cell j and 0 otherwise*/
```

Returning to FIG. 4, once batch compatibility numbers have been determined at step 402, the plurality of cells are sorted according to the batch compatibility numbers in order to obtain a sorted list of cells at 404. The following figure shows an example of a sorted list of cells.

Figure 7:
FIG. 7 is a diagram illustrating an embodiment of a sorted list of cells.

FIG. 7 is a diagram illustrating an embodiment of a sorted list of cells. In this example, the sorted list (700) is generated using the cell compatibility matrix from FIG. 5. The list is sorting in this example in descending order so that cell 6 (which is compatible with four other cells) is listed first, cell 4 (which is compatible with four other cells) is listed second, cell 2 (which is compatible with three other cells) is listed third, cell 1 (which is compatible with three other cells) is listed fourth, cell 5 (which is compatible with two other cells) is listed fifth, and cell 3 (which is compatible with two other cells) is listed sixth. This is one example of a sorted list which is generated at step 404 in FIG. 4. Although the example of FIG. 7 evaluates the list from bottom to top (i.e., in ascending order), the techniques described herein also work with a list sorted in ascending order.

The following shows another example where a sorted cell compatibility matrix (which is one example of a sorted list of cells) is generated in pseudocode:

```
/*Calculate the batchCompatibilityScore of each cell k by
summing the its corresponding row of M. */
Define a [nCells x 1] vector batchCompatibilityScore
for each cell k = 1:nCells:
   batchCompatibilityScore(k) = sum(M(k,:))
end
Define a function [Y, I] = sort(X) such that:
   X is a vector of values
   Y is the elements of X, sorted in ascending order
   I is a vector of indices such that X(I) = Y
Define a [nCells x 1] vector Cmap as follows:
   [~,Cmap] = sort(batchCompatibilityScore)
/*Therefore, the element Cmap(1) is the index of the cell
with the lowest batchCompatibilityScore value */
Define a [nCells x nCells] matrix C, the sorted
compatibility matrix
/*Step through each row of C. Map over the corresponding
values from the M matrix to the C matrix, using Cmap as a
mapping key. */
For each cell k = 1:nCells:
   C(k,:) = M(Cmap(k),Cmap)
end
/*The resulting C matrix is ordered such that as the
row/column number of C increases, the cells that correspond
to those rows will have higher batch-compatibility. A cell
represented by row k in the C matrix corresponds to the
Cmap(k)-th row in the M matrix. */
```

Returning to FIG. 4, at 406, a list of compatible cells to include in a battery is generated, including by evaluating the plurality of cells according to the order specified by the sorted list of cells and beginning with a cell with the lowest batch compatibility number. An example of this is shown in the following figure.

Figure 8:
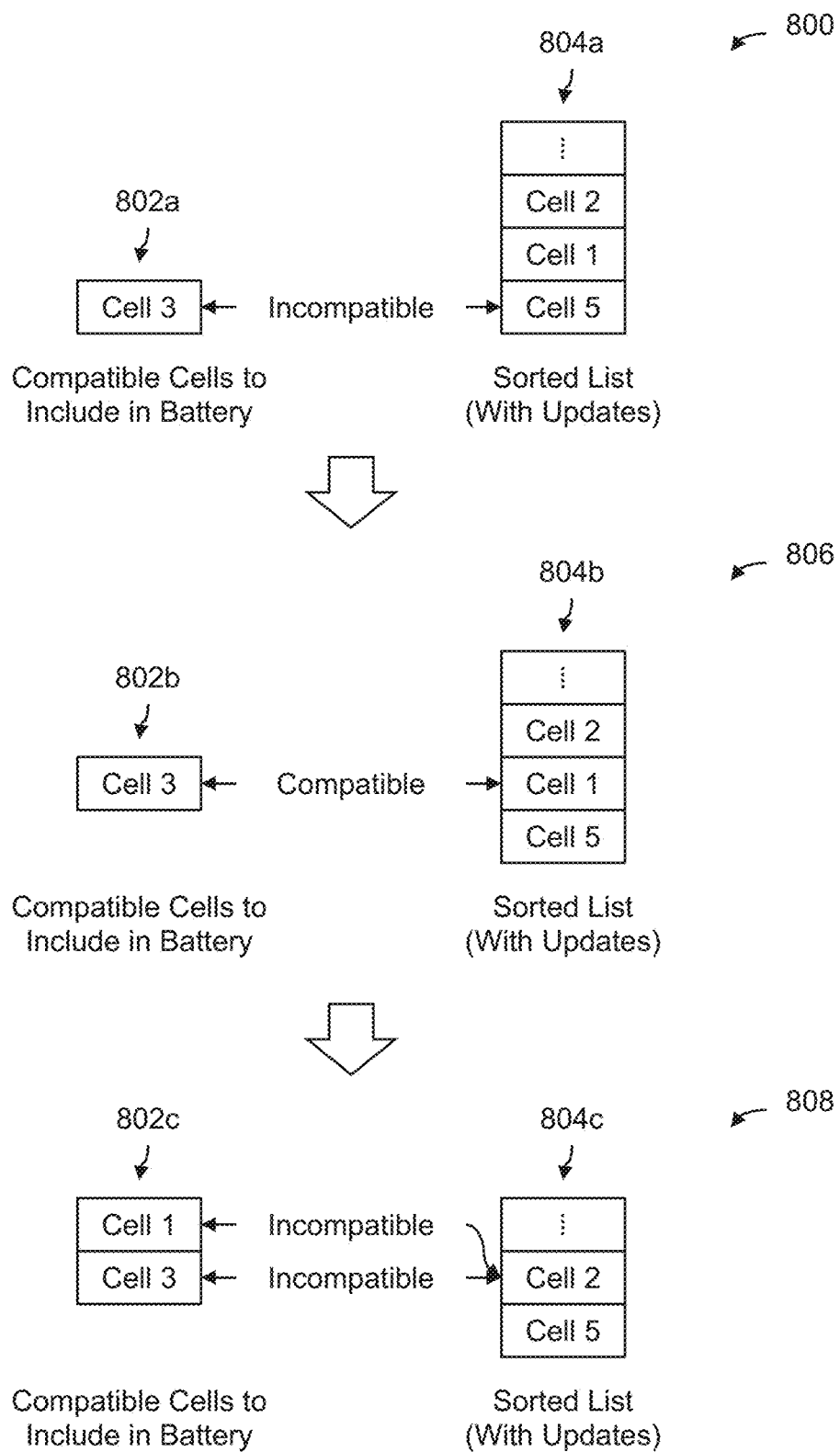
FIG. 8 is a diagram illustrating an embodiment of cells evaluated according to the order specified by the sorted list of cells.

FIG. 8 is a diagram illustrating an embodiment of cells evaluated according to the order specified by the sorted list of cells. This example continues the example of the previous figure. Initially, the set of compatible cells to include in a battery is an empty set (e.g., { }). The cell with the lowest batch compatibility number is evaluated first and is (e.g., automatically) included in the set of compatible cells to include in the battery. In this example, this means that cell 3 is included in the set of cells to include in the battery (see, e.g., FIG. 7 where cell 3 is at the bottom of the sorted list).

Once the set of compatible cells to include in the battery is not empty, any cell being evaluated is compared against all cells in the set. Diagram 800 shows the first iteration of this. The left column (802a) shows the current set of compatible cells, which in the state shown includes only cell 3. The right column (804a) shows the sorted list, updated to reflect any cells which have been selected to be included in the battery. As such, updated sorted list 804a does not include cell 3 since it has been selected for inclusion in the battery.

In diagram 800, cell 5 (i.e., the cell being evaluated) is compared against cell 3 (i.e., the current set of compatible cells to include in the battery). In some embodiments, a cell compatibility matrix is consulted to see if two cells are compatible with each other. As shown in FIG. 5, cell 5 and cell 3 are not compatible with each other and therefore cell 5 is not moved from the right column to the left column.

Diagram 806 shows the next cell in the updated sorted list being evaluated. In this iteration, the compatibility of cell 3 (see left column 802b) and cell 1 (see right column 804b) is checked. Per the cell compatibility matrix shown in FIG. 5, those two cells are compatible, so cell 1 is moved from the right column to the left column.

Diagram 808 shows the next iteration. In this state, cell 2 (see right column 804c) is being evaluated and is compared against cell 3 as well as cell 1 (see left column 802c). Cell 2 is incompatible with both cells, so cell 2 is not moved from the right column to the left column. In order to be included in the set on the left, a cell being evaluated in the right column needs to be compatible with all cells in the left column.

Once enough compatible cells have been identified to fill a battery, the process stops (at least temporarily) and the identified cells are included in the next battery being assembled. In some embodiments, once selected, the compatible cells do not have to follow any particular order within the battery and any appropriate technique may be used to pack or layer the cells in the battery. The cell matching process may then be repeated on the remaining cells in the sorted list to identify compatible cells to include in the next battery.

In pseudocode, another example of step 406 in FIG. 4 is:

---

Define a [nCells × nCells] matrix Cremnant such that:
Cremnant = C;
/* Cremnant represents the remaining cells - in sorted order - that have not been matched to any sets yet. */
Define a function [validSet] = findValidSet(iCell,X) such that:
   X is a compatibility matrix where each element (k,j)
   is cell k's compatibility with cell j. Compatibility
   is expressed as a 1 if compatible and a 0 if not.
   iCell is a cell index.

validSet is a [12 × 1] vector where validSet(1) =
iCell and validSet(2:12) are the 11 lowest indices in
matrix X corresponding cells that are compatible with
both the cell denoted by iCell and each other. The
function returns validSet = NULL if there are no valid
sets possible.
For each cell k = 1:nCells
   /* Check if this cell is compatible with at least 11
   other cells */
   If sum(Cremnant(k,:) >= 11)
      validSet = findValidSet(k,Cremnant)
      If a valid matching set was found:
         iSet = iSet + 1
         sets(iSet,:) = validSet
         /* Remove all cells in the corresponding to
         the just-formed set from the Cremnant matrix
         so they do not get reused. */
         Cremnant(validSet,:) = 0
         Cremnant(:,validSet) = 0
      end
   end
end

---

If desired, the following contains more information about the validSet=findValidSet(iCell,X) function:

---

As previously described in the sorting methodology:
   X is a compatibility matrix where each element (k,j)
   is cell k's compatibility with cell j. Compatibility
   is expressed as a 1 if compatible and a 0 if not.
   iCell is a cell index.
   validSet is a [12 × 1] vector where validSet(1) =
   iCell and validSet(2:12) are the 11 lowest indices in
   matrix X corresponding cells that are compatible with
   both the cell denoted by iCell and each other. The
   function returns validSet = NULL if there are no valid
   sets possible.
The function will choose the cells with the lowest indices
that can form a matching set. Thus, this function relies on
the fact that X is a sorted compatibility matrix in order
to form a set with the least batch-compatible cells. The
implementation is as follows:
/* Initialization */
Define a vector matchList as the list of indices of all
cells that are compatible with cell iCell, sorted in
ascending order.
Define a [1 × 12] vector tempSet, container of cell indices
for prospective sets.
tempSet(1) = iCell
tempSet(2:12) = 0
/* This counter keeps track of the size of our prospective
set */
iSet = 2
/*This counter tracks where we are in the matchingCells
list when adding new prospective set members. */
iSearch = 1
/* This counter tracks the matchingCells index where we
started the search. */
iSearchStart = 1
Define a function [flag] = isValidSet(set,X) :
   set is a [1 × 12] vector of cell indices.
   X is the compatibility matrix
   flag is a boolean that is TRUE if the cells
   corresponding to all non-zero indices in set are
   compatible with each other and FALSE if otherwise.
/* Begin search for a valid set */
/* The overall method is to search through the list of
compatible cells, adding them to the tempSet container one
at a time and checking if all sets in tempSet are still
valid. If the list of cells is exhausted, then remove all
cells from tempSet except iCell and start the process over
at from another position in the list of compatible cells.

-continued

```
If all starting positions are exhausted, then there are no
valid sets in X containing iCell. */
While true:
   tempSet(iSet) = matchingCells(iSearch)
   If isValidSet(tempSet,X)
      /*If we have a valid set so far, then continue
      searching for the next valid addition to tempSet
      */
      tempSet(iSet) = matchingCells(iSearch) ;
      /* If we just added the 12th cell to the set,
      then we're done */
      If iSet == 12
         validSet = tempSet;
         return
      End
      iSet = iSet + 1
   end
   /* We're not done yet, so increment iSearch to search
   farther down the matchingCells list*/
   iSearch = iSearch + 1;
   /* Other exit conditions */
   If iSearch > number of elements of matchingCells
      /*We've run out of cells to search through and
      haven't found a valid set. Restart the search but
      at one index farther up on the matchingCells
      list. */
      iSet = 1;
      tempSet(2:12) = 0
      iSearchStart = iSearchStart + 1 /*increment our
      search starting point*/
      iSearch = iSearchStart /*reset our search
      location in matchingCells*/
   end
   If iSearchStart > number of elements in matchingCells
      /*If iSearchStart exceeds the length of
      matchingCells, we have started the search in
      every position and haven't found any valid sets.
      We can call off the search. */
      validSet = NULL
      return
   end
end
```

Returning to FIG. 7, as shown there, in some cases there will be cells with the same batch compatibility number (i.e., a tie). For example, cell 6 and cell 4 are tied with each other, cell 2 and cell 1 are tied with each other, and cell 5 and cell 3 are tied with each other. The following figures describe various tiebreaker examples when two or more cells have the same batch compatibility number.

Figure 9:
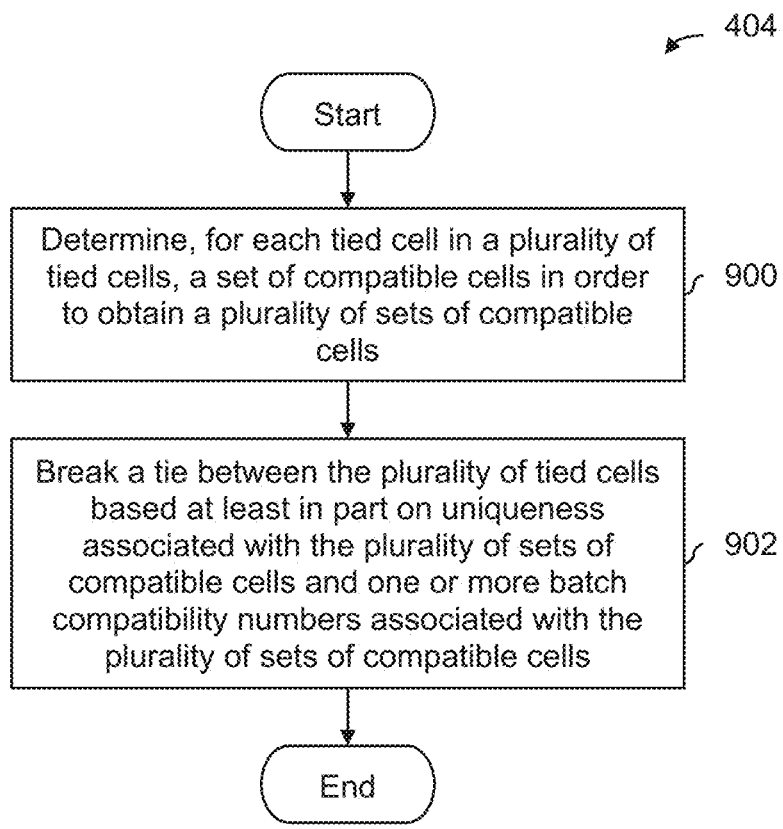
FIG. 9 is a flowchart illustrating an embodiment of a tiebreaker process.

FIG. 9 is a flowchart illustrating an embodiment of a tiebreaker process. In some embodiments, the process is performed on any groups of tied cells at step 404 in FIG. 4 when a sorted list of cells is generated. This tiebreaker process and other tie breaker processes described herein may be repeated as needed for each group of tied cells (e.g., without considering other tied cells in other groups and/or cells which are not tied).

At 900, a set of compatible cells is determined for each tied cell in a plurality of tied cells in order to obtain a plurality of sets of compatible cells. For example, in FIG. 7, cell 6 and cell 4 are tied with each other because they both have a batch compatibility number of 4. Step 900, applied to those tied cells, would determine what cells are compatible with cell 6 and what cells are compatible with cell 4.

At 902, a tie between the plurality of tied cells is broken based at least in part on uniqueness associated with the plurality of sets of compatible cells and one or more batch compatibility numbers associated with the plurality of sets of compatible cells. To continue the example from above and FIG. 7, uniqueness and batch compatibility numbers associated with the set of cells that are compatible with cell 6 and the set of cells that are compatible with cell 4 would be considered in breaking the tie between cell 6 and cell 4.

In some embodiments, uniqueness is considered or evaluated globally at step 902. For example, a global uniquification process may be performed on the plurality of sets of compatible cells so that any duplicates are removed. Alternatively, uniqueness may be evaluated locally, for example in the context of a particular level or index within a sorted or ordered list of compatible cells. The following figures show some examples of both.

Figure 10:
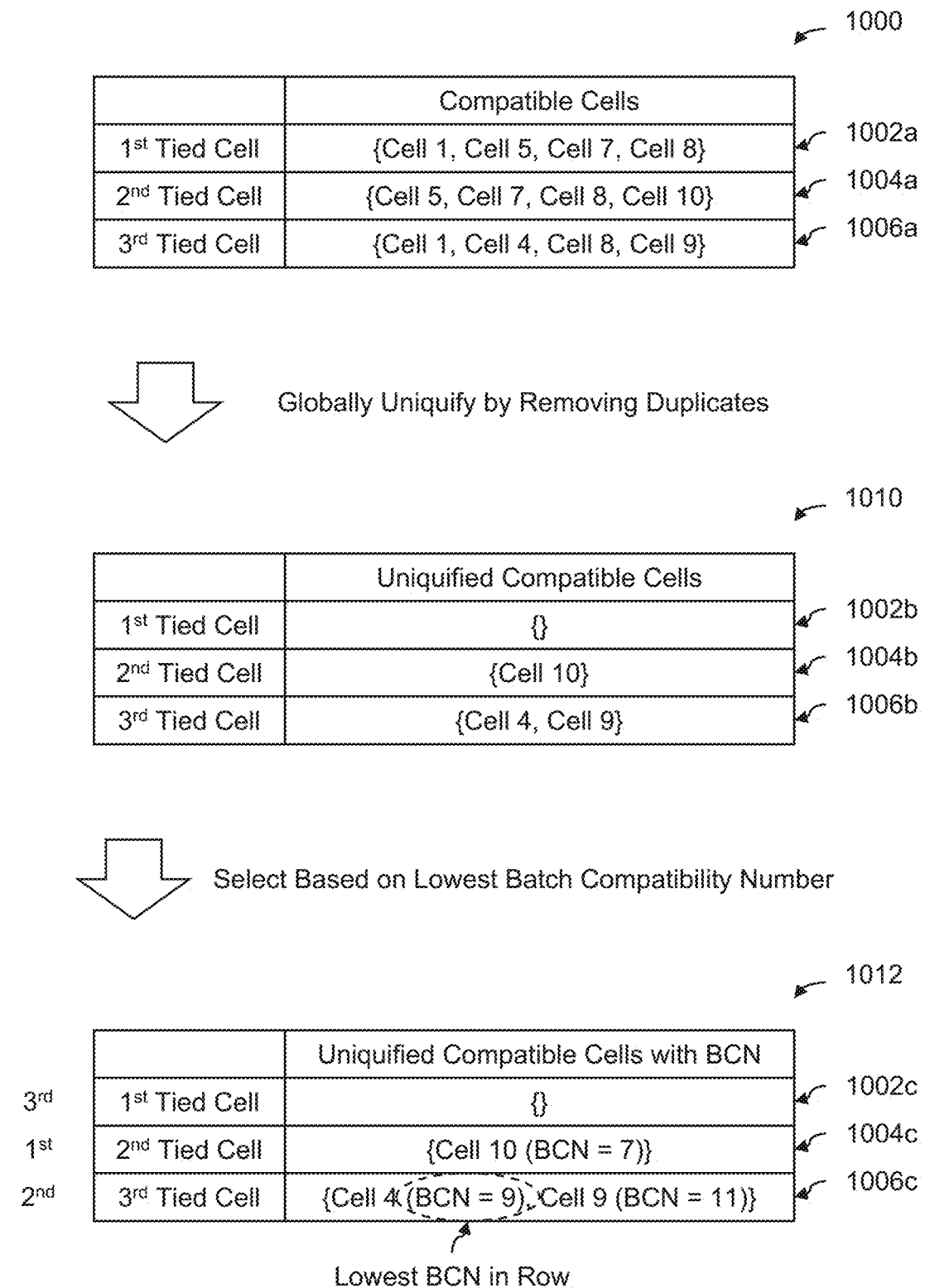
FIG. 10 is a diagram illustrating an embodiment of a tiebreaker technique which first globally uniquifies the cells which are compatible with the tied cells and then examines the batch compatibility numbers of the uniquified compatible cells.

FIG. 10 is a diagram illustrating an embodiment of a tiebreaker technique which first globally uniquifies the cells which are compatible with the tied cells and then examines the batch compatibility numbers of the uniquified compatible cells. This is one example of how step 902 in FIG. 9 may be performed.

Diagram 1000 shows three exemplary tied cells at the beginning of the tiebreaker process. In this example, all of the tied cells have a batch compatibility number of 4 because they are compatible with four other cells. The first tied cell (see row 1002a) is compatible with cell 1, cell 5, cell 7, and cell 8. The second tied cell (see row 1004a) is compatible with cell 5, cell 7, cell 8, and cell 10. The third tied cell (see row 1006a) is compatible with cell 1, cell 4, cell 8, and cell 9.

The cells which are compatible with the tied cells (shown in the right column in diagram 1000) are globally uniquified (e.g., across all sets/rows) by removing any duplicates. Since cell 1, cell 5, cell 7, and cell 8 occur more than once in diagram 1000, those cells are removed and diagram 1010 shows the sets/rows without those duplicate cells. Row 1002b (associated with the first tied cell) is now an empty set, row 1004b (associated with the second tied cell) now includes cell 10, and row 1006b (associated with the third tied cell) now includes cell 4 and cell 9.

The batch compatibility numbers of the uniquified compatible cells are then examined. Diagram 1010 and diagram 1012 show the same uniquified compatible cells in their right columns, but diagram 1012 also shows the corresponding batch compatibility numbers in parenthesis. The ties are broken based on the lowest batch compatibility number (if any) for each row. Row 1006c (associated with the third tied cell) has two cells/scores, but the lowest batch compatibility number in that row is a batch compatibility number of 9 (corresponding to cell 4). Since that batch compatibility number of 9 (corresponding to cell 4) is not lower than the batch compatibility number of 7 in row 1004c (corresponding to the second tied cell), the second tied cell is selected first. That is, the second tied cell in this example would be listed first in a sorted list and be evaluated for inclusion in a battery before the other tied cells in this group. The third tied cell would be selected next (i.e., second) since it has the next lowest batch compatibility number (i.e., a batch compatibility number of 9 for that row).

Row 1002b/1002c in diagram 1010/1012 is empty and so there is no corresponding batch compatibility number to show or examine. Such empty sets after duplicates are removed may be listed or selected last during the tiebreaker process (e.g., because they are compatible with cells which in turn are compatible with other tied cells in the group, and so there is no unique or special match those tied cells can make compared to the other tied cells in the group). As such, the tiebreaker process would (at the end) have the second tied cell first, the third tied cell second, and the first tied cell third.

The following figure describes this more formally and/or generally in a flowchart.

Figure 11:
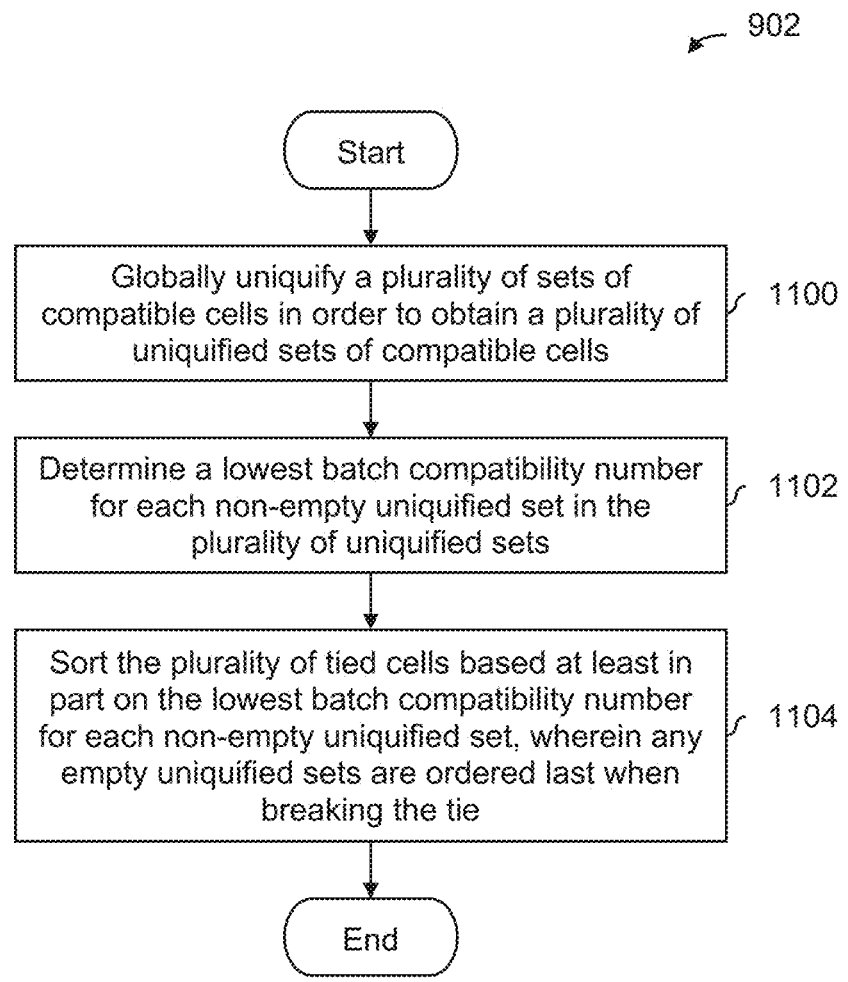
FIG. 11 is a flowchart illustrating an embodiment of a tiebreaker process which first globally uniquifies the cells which are compatible with the tied cells and then examines the batch compatibility numbers of the uniquified compatible cells.

FIG. 11 is a flowchart illustrating an embodiment of a tiebreaker process which first globally uniquifies the cells which are compatible with the tied cells and then examines the batch compatibility numbers of the uniquified compatible cells. In some embodiments, step 902 in FIG. 9 includes the process shown.

At 1100, a plurality of sets of compatible cells associated with the plurality of tied cells are globally uniquified in order to obtain a plurality of uniquified sets of compatible cells. See, for example, the removal of duplicates between diagram 1000 and diagram 1010 in FIG. 10.

At 1102, a lowest batch compatibility number is determined for each non-empty uniquified set in the plurality of uniquified sets. In diagram 1012 in FIG. 10, for example, this step is not applicable for row 1002c since that row is empty. For row 1004c in diagram 1012, the lowest batch compatibility number is 7 and for row 1006c, the lowest batch compatibility number is 9.

At 1104, the plurality of tied cells are sorted based at least in part on the lowest batch compatibility number for each non-empty uniquified set, wherein any empty uniquified sets are ordered last when breaking the tie. See, for example, the ordering shown in diagram 1012 in FIG. 10. Note row 1004c is ordered first by the tiebreaker process (because it has the lowest batch compatibility number of 7) and row 1006c is ordered next (because it has the next lowest batch compatibility number of 9). Row 1002c (which became an empty set after uniquification) is ordered last by the tiebreaking process.

It is noted that the technique described in FIG. 10 and FIG. 11 is not necessarily the optimal tie breaking technique. For example, in FIG. 10, if cell 1 had the lowest batch compatibility number, then it is conceivable that the first tied cell or the third tied cell should be ranked first, rather than the second tied cell. A better tie breaking technique (e.g., in terms of performance) is described below, but as will be described in more detail below, the number of steps or iterations in the following technique is variable (which could make the runtime longer whereas the technique described above has a fixed number of steps) and the degree of complexity is greater (e.g., a findTies function is called recursively in pseudocode below). For some applications, the performance improvement is not worth the potentially longer runtime and/or increased complexity and the technique described above is used. In other applications (e.g., where the performance improvement is worth the costs described above), the technique described below may be used. In the example below, uniqueness at step 902 in FIG. 9 is evaluated in the context of a particular level in a sorted or ordered list of compatible cells. The following pseudocode shows an example of this.

---

Define a function [C_noties, Cmap_noties] = tiebreaker(C,Cmap} such that
   C is the compatibility matrix
   Cmap is a vector of indices of the original set of
   cells, sorted by compatibility score
   C_noties is the compatibility matrix with a secondary
   sorting process applied in order to break up ties
   between cells with equal batchCompatibilityScore
   values
   Cmap_noties is the revised mapping matrix that maps a
   the kth cell of C_noties with the index of the
   original set of cells
Define nCells as the number of cells in the batch (the size of one dimension of C)

-continued

/* Find the batchCompatibilityScore values of C */
for each cell k = 1 :nCells:
   batchCompatibilityScore_sorted(k) = sum(C(k,:))
end
/* Note that since C is sorted,
batchCompatibilityScore_sorted is already sorted in
ascending value */
/* Temporarily assign output variables */
Cmap_noties = Cmap
C_noties = C
/* Find all ties */
Define a function [Y] = findTies(X) such that:
   X is a vector of all batchCompatibilityScore values
   Y is a set of arrays such that each array contains the
   indices of each cell that has the same
   batchCompatibilityScore with other cells in that
   array.
   Example (note that all indices are 1-indexed): if X =
   [1 2 3 3 34 5 6 6 7] then Y = findTies(X) returns:
   Y = [[3 4 5], [8, 9]]
   And using cell array notation, Y{1} = [3, 4, 5] and
   Y{2} = [8, 9]
ties = findTies(batchCompatibilityScore_sorted)
Define numTies as the number of arrays in ties
for each tie k = 1:numTies
   tiedCells = ties{k}
   /* Find the least compatible cell in each cell in
   tiedCells*/
   minCell = min(C(tiedCells,:))
   /* If there are multiple cells that have the same
   minCell value, there is another tie, the findTies
   function must be recursively run on the remaining tied
   cells until each value minCell is lowest indexed cell
   in C(tiedCells, :), unique to all other cells it is
   tied with at the appropriate level of the tie. */
   /* Update C to be in the new order */
   C noties(ties{k},:) = C(ties{k} (iTiebreakOrder),:)
   Define numTiedCells as the number of elements in
   tiedCells
   for each cell j in 1 :numTiedCells:
      Cmap_noties(ties{k} (j)) =
      Cmap_noties(ties{k} (iTiebreakOrder(j))
   end
end

---

The following figure shows an example of the above pseudocode using exemplary batch compatibility numbers.

Figure 12:
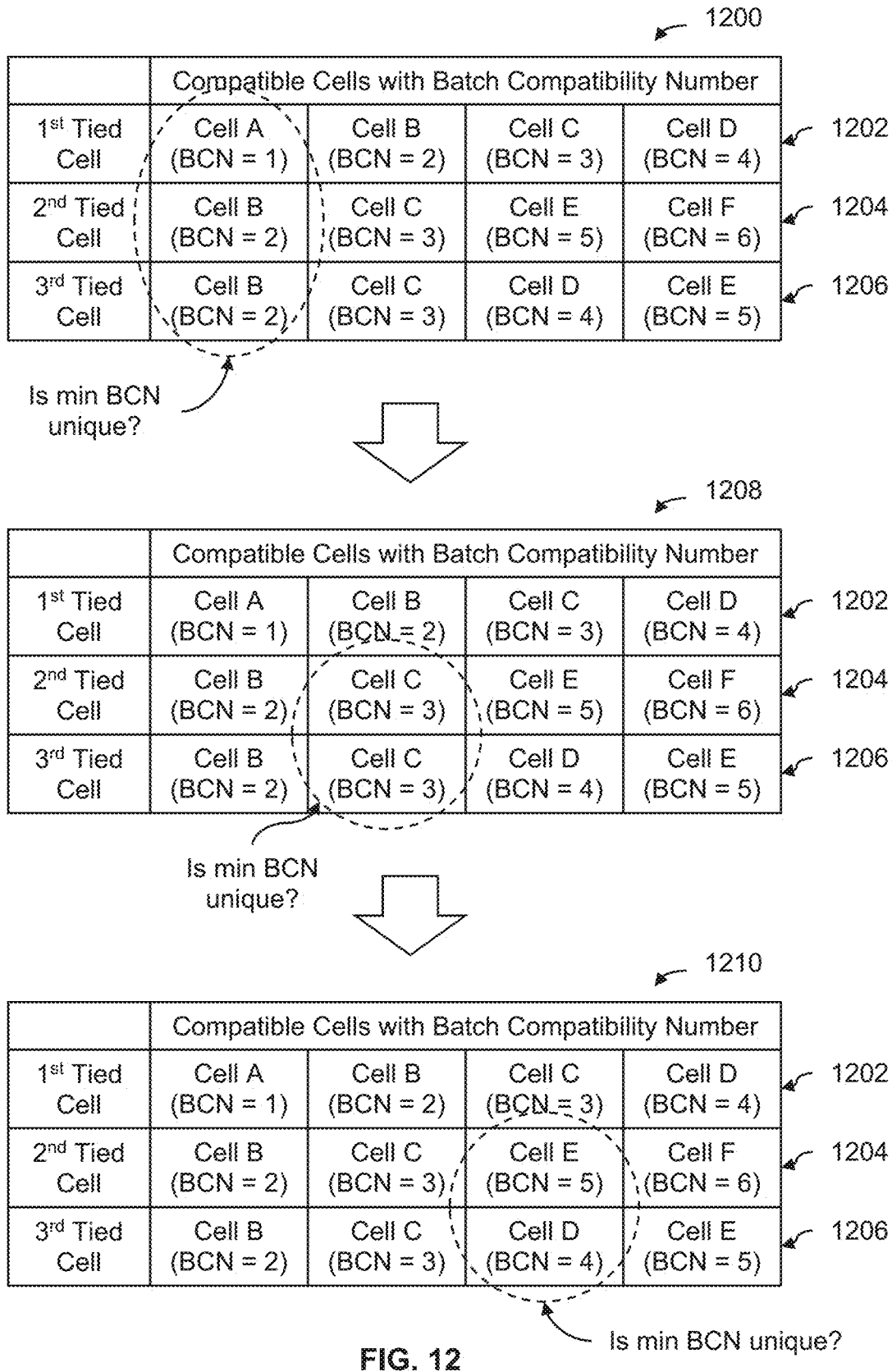
FIG. 12 is a diagram illustrating an embodiment of a tiebreaker technique where cells which are compatible with the tied cells are ordered based on batch compatibility number and then evaluated on a level-by-level basis.

FIG. 12 is a diagram illustrating an embodiment of a tiebreaker technique where cells which are compatible with the tied cells are ordered based on batch compatibility number and then evaluated on a level-by-level basis.

Diagram 1200 shows the three exemplary tied cells at the beginning of the tiebreaker process. All three tied cells have batch compatibility numbers of 4 and are therefore tied. The first tied cell (see row 1202) is compatible with cell A, cell B, cell C, and cell D; the second tied cell (see row 1204) is compatible with cell B, cell C, cell E, and cell F; the third tied cell (see row 1206) is compatible with cell B, cell C, cell D, and cell E.

All of the compatible cells (shown in the right column) have their batch compatibility numbers shown in parenthesis. Each set of compatible cells (e.g., row 1202, row 1204, and row 1206) is sorted based on the batch compatibility number to produce a sorted list of compatible cells. Note, for example, that the compatible cells in row 1202, row 1204, and row 1206 are sorted in ascending batch compatibility numbers going from left to right.

With the sets of compatible cells sorted based on batch compatibility number, a check is performed on a level-by-level basis going from left to right (i.e., in ascending batch compatibility number order). The check determines whether the minimum batch compatibility number is unique (e.g., for that level and for the cells or batch compatibility numbers being evaluated). Diagram 1200 shows the first check at the first (i.e., lowest) level. At that level, the lowest batch compatibility number is 1 (associated with the first tied cell's cell A) and that batch compatibility number is unique so the first tied cell wins that tiebreaker round.

Diagram 1208 shows the second check at the second-lowest level. Since the first tied cell has already been selected or picked by the tiebreaker process, the first tied cell is not part of the check here. Note, for example, that its first place ordering is shown to the left of row 1202 in diagram 1208. In this check, the minimum batch compatibility number is 3, but that batch compatibility number is not unique so the tiebreaking process moves on to the next level without declaring a winner.

Diagram 1212 shows the third check at the third-lowest level. The lowest batch compatibility number here is 4 (associated with the third tied cell's cell D) and that batch compatibility number is unique. Therefore, the third tied cell wins this tiebreaker round. By elimination, the second tied cell is third/last. The final ordering produced by the exemplary tiebreaker process is shown to the left of the table in diagram 1210: the first tied cell, then the third tied cell, and finally the second tied cell. As shown here, uniqueness may be considered locally in the context of a level in a sorted or ordered list of cells (e.g., without considering other levels) and/or in the context of the cells being compared (e.g., without considering other cells which are not part of the comparison).

The following figure describes this more formally and/or generally in a flowchart.

Figure 13:
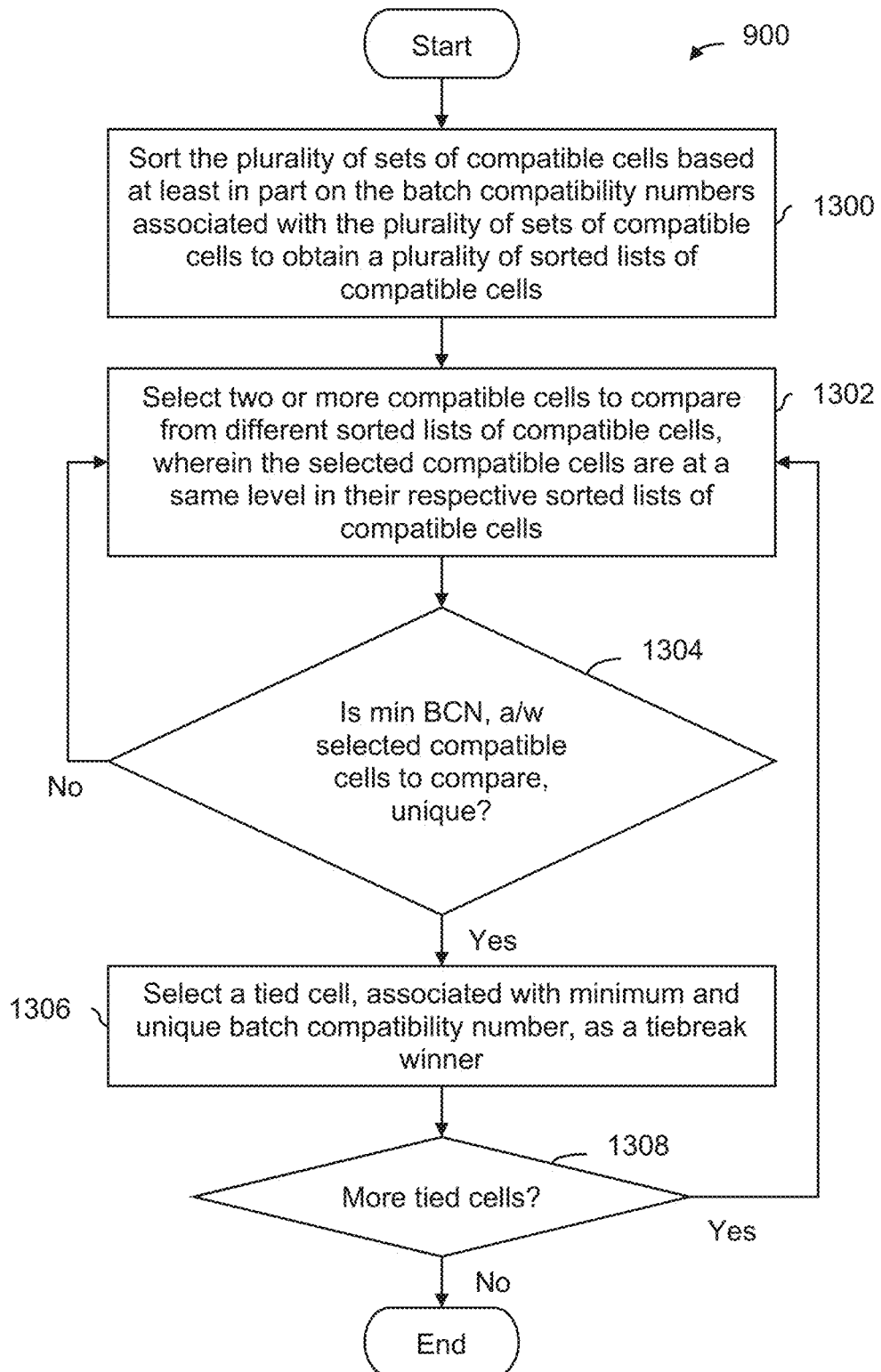
FIG. 13 is a flowchart illustrating an embodiment of a tiebreaker process where cells which are compatible with the tied cells are ordered based on batch compatibility number and then evaluated on a level-by-level basis for uniqueness.

FIG. 13 is a flowchart illustrating an embodiment of a tiebreaker process where cells which are compatible with the tied cells are ordered based on batch compatibility number and then evaluated on a level-by-level basis for uniqueness. In some embodiments, step 900 in FIG. 9 includes the process shown.

At 1300, the plurality of sets of compatible cells are sorted based at least in part on the batch compatibility numbers associated with the plurality of sets of compatible cells to obtain a plurality of sorted lists of compatible cells. See, for example, diagram 1200 in FIG. 12. Row 1202, row 1204, and row 1206 are sorted in ascending batch compatibility number order (where the batch compatibility numbers used for sorting are associated with the cells that are compatible with the tied cells).

At 1302, two or more compatible cells to compare are selected from different sorted lists of compatible cells, wherein the selected compatible cells are at a same level in their respective sorted lists of compatible cells. In diagram 1200 in FIG. 12, for example, compatible cell A (from row 1202), compatible cell B (from row 1204), compatible cell B (from row 1206) are all in the same column and are selected for comparison.

At 1304, it is determined whether a minimum batch compatibility number, associated with the selected compatible cells to compare, is unique. In diagram 1200 in FIG. 12, for example, the minimum batch compatibility number is one and it is unique. If so, a tied cell, associated with minimum and unique batch compatibility number, is selected as a tiebreak winner. In diagram 1200 in FIG. 12, for example, the first tied cell is selected as the winner for the first round.

At 1308, it is determined if there are more tied cells. In the example of FIG. 12, the second tied cell and third tied cell still have unresolved priorities or orders with respect to each other and therefore the decision at step 1308 for that case is Yes. If there are no more tied cells, the process ends.

If there are more tied cells at step 1308, two or more compatible cells to compare are selected at step 1302. In diagram 1208 in FIG. 12, for example, any tied cells which have won a tiebreaking round are no longer considered (e.g., the first tied cell is no longer considered) and the selected compatible cells are associated with the next level (e.g., the comparison moves from the lowest level to the second-lowest level).

If it is determined at step 1304 that the minimum batch compatibility number, associated with the selected compatible cells to compare, is not unique, then two or more compatible cells to compare are selected at step 1302. See, for example, diagram 1208 in FIG. 12. In that comparison, the minimum batch compatibility number is three and it is not unique. Therefore, no winner is declared for that round and the comparison moves on to the next level (in that example, the second-highest level) and the compatible cells in the corresponding column.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method, comprising:
providing a plurality of cells associated with a plurality of cell characteristics;
for each cell among the plurality of cells, determining a batch compatibility number based at least in part on the plurality of cell characteristics associated with the plurality of cells, wherein the batch compatibility number indicates a number of compatible cells with that cell;
evaluating the plurality of cells according to the batch compatibility numbers;
identifying a plurality of compatible cells based on evaluating; and
assembling a battery by including the plurality of compatible cells from the plurality of cells in the battery.

2. The method of claim 1, wherein the plurality of cells are evaluated beginning with a cell with a lowest or highest batch compatibility number.

3. The method recited in claim 1, wherein the plurality of cell characteristics includes one of more of: a capacity, an open circuit voltage, a resistance, or a self-discharge rate.

4. The method recited in claim 1, wherein determining the batch compatibility number includes generating a cell compatibility matrix which indicates, for the plurality of cells, whether a given pair of cells is compatible.

5. The method recited in claim 1, wherein determining the batch compatibility number includes:
determining a first difference between a first cell in the plurality of cells and a second cell in the plurality of cells for a first cell characteristic;
determining a second difference between the first cell and the second cell for a second cell characteristic; and
when (1) the first difference does not exceed a first tolerance associated with the first cell characteristic and (2) the second difference does not exceed a second tolerance associated with the second cell characteristic, declaring the first cell and the second cell to be compatible.

6. The method recited in claim 1, further comprising:
determining, for each tied cell in a plurality of tied cells, a set of compatible cells in order to obtain a plurality of sets of compatible cells; and breaking a tie between the plurality of tied cells based at least in part on uniqueness associated with the plurality of sets of compatible cells and one or more batch compatibility numbers associated with the plurality of sets of compatible cells.

7. The method recited in claim 6, wherein breaking the tie between the plurality of tied cells comprises:

sorting the plurality of sets of compatible cells based at least in part on the batch compatibility numbers associated with the plurality of sets of compatible cells to obtain a plurality of sorted lists of compatible cells;

selecting two or more compatible cells to compare from different sorted lists of compatible cells, wherein the selected compatible cells are at a same level in their respective sorted lists of compatible cells; and when a minimum batch compatibility number, associated with the selected compatible cells to compare, is unique, selecting a tied cell, associated with the minimum and unique batch compatibility number, as a tiebreak winner.

8. The method of claim 6, wherein breaking the tie between the plurality of tied cells further comprises:

globally uniquifying the set of compatible cells to obtain a plurality of uniquified sets of compatible cells by removing duplicate cells that appear more than once within each set of compatible cells;

identifying the batch compatibility number for the plurality of uniquified sets of compatible cells; and selecting a cell with lowest batch compatibility number among the compatible cells for each tied cell in the plurality of uniquified sets of compatible cells.

9. The method of claim 1, further comprising:

sorting the plurality of cells according to the batch compatibility numbers in order to obtain a sorted list of cells; and evaluating the plurality of cells according to the batch compatibility numbers beginning with a cell with a lowest or highest batch compatibility number.

10. The method of claim 1, wherein the plurality of cells are from a same manufacturing run.

11. A battery formed according to the method of claim 1.

12. A method, comprising:

providing a plurality of cells associated with a plurality of cell characteristics;

identifying, among the plurality of cells, a first cell with a batch compatibility number indicative of one or more cell characteristics associated with the first cell, wherein the batch compatibility number indicates a number of compatible cells with the first cell;

identifying, among the plurality of cells excluding the first cell, a second cell with a same batch compatibility number as the first cell; and assembling a battery by including at least the first cell and the second cell in the battery.

13. The method recited in claim 12, wherein the plurality of cell characteristics includes one of more of: a capacity, an open circuit voltage, a resistance, or a self-discharge rate.

14. The method recited in claim 12, further comprising:
generating a cell compatibility matrix which indicates, for the plurality of cells, whether a given pair of cells is compatible.

15. The method recited in claim 12, further comprising:
determining a first difference between the first cell and the second cell a first cell characteristic;
determining a second difference between the first cell and the second cell for a second cell characteristic; and
when (1) the first difference does not exceed a first tolerance associated with the first cell characteristic and (2) the second difference does not exceed a second tolerance associated with the second cell characteristic, declaring the first cell and the second cell to be compatible.

16. The method recited in claim 12, further comprising:
determining, for each tied cell in a plurality of tied cells, a set of compatible cells in order to obtain a plurality of sets of compatible cells; and
breaking a tie between the plurality of tied cells based at least in part on uniqueness associated with the plurality of sets of compatible cells and one or more batch compatibility numbers associated with the plurality of sets of compatible cells.

17. The method recited in claim 16, wherein breaking the tie between the plurality of tied cells comprises:
sorting the plurality of sets of compatible cells based at least in part on the batch compatibility numbers associated with the plurality of sets of compatible cells to obtain a plurality of sorted lists of compatible cells;
selecting two or more compatible cells to compare from different sorted lists of compatible cells, wherein the selected compatible cells are at a same level in their respective sorted lists of compatible cells; and
when a minimum batch compatibility number, associated with the selected compatible cells to compare, is unique, selecting a tied cell, associated with the minimum and unique batch compatibility number, as a tiebreak winner.

18. The method of claim 16, wherein breaking the tie between the plurality of tied cells further comprises:
globally uniquifying the set of compatible cells to obtain a plurality of uniquified sets of compatible cells by removing duplicate cells that appear more than once within each set of compatible cells;
identifying the batch compatibility number for the plurality of uniquified sets of compatible cells; and
selecting a cell with lowest batch compatibility number among the compatible cells for each tied cell in the plurality of uniquified sets of compatible cells.

19. The method of claim 12, further comprising:
sorting the plurality of cells according to the batch compatibility numbers in order to obtain a sorted list of cells; and
evaluating the plurality of cells according to the batch compatibility numbers beginning with a cell with a lowest or highest batch compatibility number.

20. A battery formed according to the method of claim 12.

* * * * *